Nov. 29, 1960

R. J. ANDRES

PROCESS FOR PLATING A SILICON BASE SEMICONDUCTIVE UNIT WITH NICKEL

Filed June 20, 1957

2,962,394

INVENTOR.
Raymond J. Andres
BY
Mueller & Aichele
Attys.

United States Patent Office 2,962,394

Patented Nov. 29, 1960

2,962,394

PROCESS FOR PLATING A SILICON BASE SEMI-CONDUCTIVE UNIT WITH NICKEL

Raymond J. Andres, Scottsdale, Ariz., assignor to Motorola, Inc., Chicago, Ill., a corporation of Illinois Filed June 20, 1957, Ser. No. 666,901

2 Claims. (Cl. 117—213)

This invention relates to semiconductor devices such as diodes and more particularly to silicon bodies for such devices, to methods of depositing metal on the surface or selected portions of the surface of such dice so that improved electrical contact can be made thereto and to methods of preparing a surface of a silicon body to receive a layer of deposited metal.

It is known that silicon may be used as a rectifier or diode by preparing a PN junction in a wafer or die thereof. However, substantial difficulty has been experienced in making satisfactory ohmic and mechanical contact with a silicon diode wafer. Some commercially available diodes employ spring-biased leads to press against the surface of the silicon. This arrangement has the disadvantage of being unreliable in applications where the units will vibrate. There is also serious danger of cracking the die during assembly. Other diodes are made by the direct soldering of a conductive lead to the silicon wafer but difficulty has been experienced in wetting the silicon surface with the solder.

Attempts have been made to plate or otherwise coat silicon diodes with a conductive metal. For example, it has been proposed to deposit metallic nickel on such a surface as, for example, by the so-called "electroless" method which involves the reduction of nickelous chloride from solution by sodium hypophosphite. This method has heretofore been unsatisfactory, in that the nickel so applied is of poor adherence and can easily be peeled from the silicon surface.

One method of manufacturing silicon diodes involves the diffusion of boron and phosphorous from opposite sides of a silicon wafer. This method results in the formation of glassy layers of borosilicate and phosphosilicate on the opposite faces of the wafer. The wafer is then subjected to an etching treatment to remove the glassy layers and to prepare the underlying surfaces to receive deposited metal. A number of commercially available etching compositions are suitable for the removal of both the borosilicate glass and the phosphosilicate glass although none are entirely satisfactory in the preparation of the underlying surface to receive deposited metal. In addition, commercially available etching solutions which are effective to dissolve either type of glass are effective to dissolve both so that both layers are removed in a single etching operation. Heretofore, it has not been possible to remove only one type of glass by an etching treatment without resorting to masking procedures which are difficult and often unsatisfactory. In many cases, it is desirable to accomplish selective etching so that only a selected portion of the surface of the wafer could be metal coated. This would be desirable, for example, in making a semiconductor device in which a soldered contact is to be made to one side only of the semiconductor body so that only one side is to be metal plated.

It is an object of the present invention, therefore, to provide a method for preparing the entire surface of a silicon die containing a PN junction so that conductive metal may be deposited thereon to form a satisfactory mechanical and ohmic contact.

It is an other object of the present invention to provide a silicon diode containing a PN junction and which has a coating of metal such as nickel on its surface to which a conductive lead may be soldered.

It is still another object of the present invention to provide a method for forming a metal plated silicon diode containing a PN junction that may be used in the assembly of a reliable rectifier having a high breakdown voltage.

It is another object of the invention to provide a method of etching a silicon body which has had both phosphorous and boron diffused into it so that only a selected portion of the surface of the body will be capable of receiving deposited metal.

It is another object of the present invention to provide a method for depositing metal only on that surface of a silicon semiconductor body which is of a particular conductivity type.

A feature of the present invention is the provision of a two-step etching method for conditioning the entire surface of the silicon wafer containing a PN junction. In accordance with the invention, a silicon wafer is immersed in an aqueous solution of hydrofluoric acid and then in an aqueous solution of an alkali metal hydroxide, such as potassium hydroxide or sodium hydroxide and hydrogen peroxide. This treatment conditions the surface of the silicon die so that it may receive and tenaciously hold a layer of metal deposited thereon.

Another feature of the present invention is the provision of a silicon die containing a PN junction and having layers of deposited metal on both surfaces thereof and adhering tenaciously thereto so that reliable mechanical and ohmic connections can be made through the metal to the silicon die.

Another feature of the present invention is a selective etching method whereby a silicon die having a layer of phosphosilicate glass on one portion of its surface and a layer of borosilicate glass on another portion is treated either with an aqueous solution of hydrofluoric acid to remove the phosphosilicate layer and prepare the underlying surface of the N conductivity type for metal deposition or with an aqueous solution of an alkali metal hydroxide and hydrogen peroxide to remove the borosilicate layer so as to prepare only the surface of the P conductivity type underlying it for the deposition of metal thereon.

Referring now to the drawings.

In accordance with the present invention a silicon base semiconductor containing a PN junction and having a layer of phosphosilicate glass on one portion of its surface and a layer of borosilicate glass on another portion is treated preparatory to the deposition of metal over the entire surface thereof by treating the semiconductor with an aqueous solution of hydrofluoric acid and an aqueous solution of hydrogen peroxide and an alkali metal hydroxide such as potassium hydroxide. The hydrofluoric acid solution is effective to etch away the phosphosilicate glass and prepare the underlying N-type surface for metal deposition. The hydrofluoric acid, however, has no effect upon the borosilicate glass. This layer is removed by the action of the solution of alkali metal hydroxide and hydrogen peroxide which in turn would have no effect upon the phosphosilicate layer. Therefore, the order of applying the etchings may be reversed, if desired. Because of the highly selective character of each of the etching solutions either the phosphosilicate layer or the borosilicate layer may be removed separately without affecting the other. Such a procedure is useful in the manufacturing of devices where it is desired to metal plate only a portion of the surface of the silicon body which has a particular conductivity type. For example, if it is desired to establish a soldered connection only to the N side of a semiconductor device the silicon wafer is treated with an aqueous solution of hydrofluoric acid which removes the phosphosilicate glass layer and prepares only that portion of the surface underlying it for receiving deposited metal. If it is desired to plate only the P side of the body then it is treated only with the aqueous solution of alkali metal hydroxide and hydrogen peroxide.

Figures 2, 3, 4, 5, 8, 9:
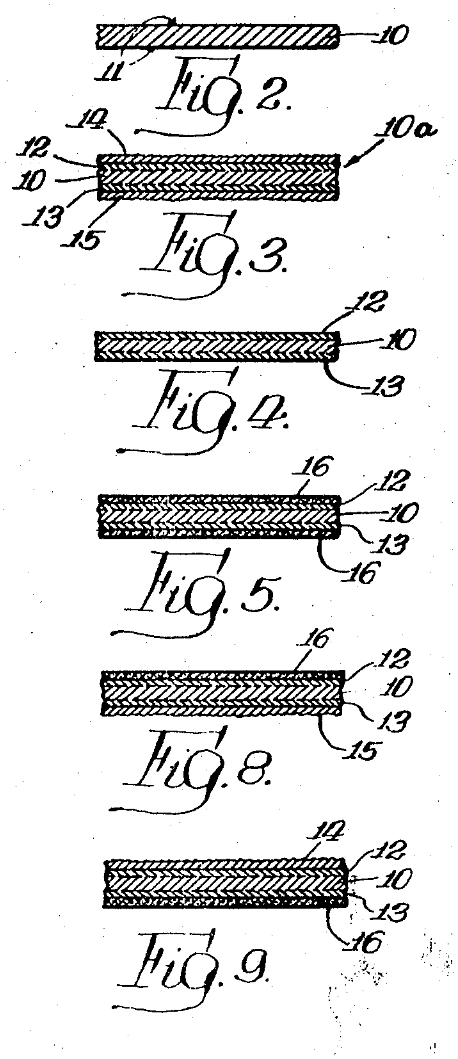
Fig. 2 is a view in section taken on the line 2—2 of Fig. 1 with the edge portion of the wafer broken away.
Fig. 3 is a similar view in section through a silicon wafer within which a PN junction has been formed by a diffusion process.
Fig. 4 is a similar view in section showing the wafer illustrated in Fig. 3 after it has been treated in accordance with the present invention.
Fig. 5 is a similar view in section of a silicon wafer after it has been nickel coated in accordance with the present invention.
Fig. 8 is a view similar to Fig. 5 of a silicon wafer that has been selectively coated with nickel on only that portion of its surface underlying a layer of phosphosilicate glass, i.e., the surface of n-type conductivity.
Fig. 9 is a view similar to Fig. 5 of a silicon wafer that has been selectively coated with nickel on only that portion of its surface underlying a layer of borosilicate glass, i.e. the surface of P-type conductivity.
Figure 1:
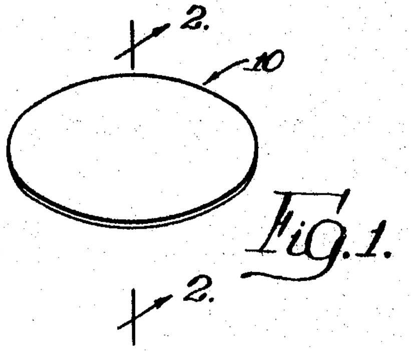
Fig. 1 is a perspective view of a silicon wafer which has been cut or otherwise separated from the silicon crystal.

Referring now specifically to the drawings, a silicon body 10 in the form of a flat disc or wafer shown in Fig. 1 has been separated from a larger crystal of silicon by a suitable slicing or cutting operation. The silicon may be of either the P or N conductivity type and is about 0.008 inch thick. The surface 11 of the wafer 10 prior to being treated by the diffusion process is relatively smooth as shown in Fig. 2. Although the wafer 10 is shown as consisting of P-type silicon, it will be understood that the process of the present invention is equally applicable in all particulars to N-type silicon.

The wafer is then treated to form a PN junction therein. This may be done by treating the P-type silicon wafer 10 with a phosphorous-containing vapor to form $N^+$ silicon layers on both surfaces thereof, lapping away one of the $N^+$ layers and treating with boron-containing vapor to form a $P^+$ silicon layer. $N^+$ and $P^+$ conductivity materials are those containing a high concentration of the donor or acceptor impurity respectively. In the manufacture of diodes it is desirable to provide layers of low resistivity material at the surfaces to which ohmic contacts are to be made. Heavily doped semiconductor materials which make up $N^+$ and $P^+$ layers have sufficiently low resistivity to permit ohmic or non-rectifying contacts to be made. The P-type silicon is treated with boron to dope it more heavily with acceptor impurity and thus provide a $P^+$ layer.

Fig. 3 is a view in section of a P-type silicon wafer that has been treated by a suitable vapor diffusion process. The layer of P silicon 10 lies between the $N^+$ silicon layer 12 and the $P^+$ silicon layer 13 the rectifying junction being formed between layers 10 and 12. In addition to the $N^+$ and $P^+$ silicon layers, the vapor diffusion process also forms phosphosilicate layer 14 and borosilicate layer 15. Since the phosphorous and boron atoms diffuse from the surface toward the center of the silicon wafer, the layers 12 and 13 are more heavily doped with phosphorous and boron respectively nearer their outer edges with the concentration of those impurities decreasing gradually in the direction of the layer 10.

In order to prepare the wafer for metallic deposition on the surface thereof, it has been found necessary to remove the glassy layers 14 and 15 so as to expose the boron and the phosphorous in the $P^+$ and $N^+$-type silicon layers respectively. It is desirable that the surface be cleaned of glassy substance without polishing it so that it is necessary to employ etching compositions which will not dissolve the silicon but will selectively attack the glassy material.

In accordance with the present invention it has been found that the glassy layers 14 and 15 are effectively removed and the surfaces properly prepared to receive a metallic coating by a two-step cleaning process. In accordance with a specific embodiment the treated silicon base 10a (shown in Fig. 3) is immersed for about 70 seconds in a solution consisting of hydrofluoric acid and water and containing about 48% by weight of hydrofluoric acid, maintained at room temperature. This treatment selectively removes the phosphosilicate layer 14 but has essentially no effect on borosilicate layer 15 in that it does not condition the underlying surface for subsequent metal coating. The wafer is then preferably rinsed with water to remove any adherent acid and immersed for about 140 seconds in an aqueous solution of hydrogen peroxide and potassium hydroxide preferably maintained at a temperature of about 85° C. However, treatments of 30 seconds to two and a half minutes at temperatures of 60° C.–95° C. are effective. A suitable solution for this purpose contains 10 grams of potassium hydroxide, 10 cubic centimeters of a 30% aqueous solution of hydrogen peroxide and 75 cubic centimeters of water. This step removes the borosilicate layer 15. If desired, the steps of the cleaning treatment may be carried out in opposite sequence with the silicon base being first immersed in the potassium hydroxide and peroxide solution and then rinsed and immersed in the hydrofluoric acid solution. However, it is essential that both steps be employed to produce proper surfaces on both sides of the silicon base.

Fig. 4 shows the layer 10 of P-type silicon between layers 12 and 13 of $N^+$ and $P^+$ type silicon respectively from which the glassy layers having been removed and having a surface similar to the surface 11 of Fig. 2. This prepared silicon wafer is now in suitable condition to receive a layer of deposited metal. Any conductive metal is suitable that is resistant to corrosion and to which a solder connection can be made. Such metals include gold, silver, cobalt and nickel. In accordance with a specific embodiment of the present invention the metal deposited is nickel. The nickel layer 16 shown in Fig. 5 is deposited according to this embodiment by immersing the prepared silicon wafers in an aqueous plating solution of the following composition:

| | Grams per liter |
|---|---|
| Ammonium chloride | 50 |
| Nickel chloride ($NiCl_2$) | 30 |
| Sodium hypophosphite | 10 |
| Ammonium citrate | 65 |
| Ammonium hydroxide—sufficient to adjust pH of the solution to 8–10. | |

The plating substance is maintained at a temperature of about 95° C. After ten minutes of immersion, a nickel layer about 0.0003" in thickness is formed on each side of the wafer.

The reduction of the nickel by the hypophosphite ion is a well-known plating process and of itself forms no part of the present invention. However, it has been found that only when the silicon base has been prepared by the surface cleaning technique previously described will metal precipitated by this process form an adherent bond to the silicon semiconductor material.

The metal layer 16 may also be deposited by known electrolytic plating processes after the semiconductor surfaces have been conditioned in accordance with the process of the present invention.

Figure 6:
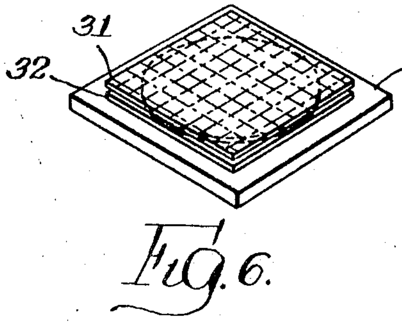
Fig. 6 shows a nickel coated wafer about to be cut into individual dice.
Figure 7:
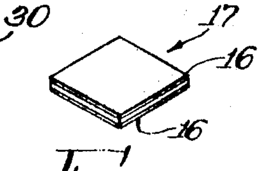
Fig. 7 is a view in perspective showing a typical nickel coated silicon die taken from the larger wafer shown in Fig. 6.

After the nickel plating step, the coated wafer is mounted on glass plate 30 between two layers of wax 31 and 32 which are scored on their surfaces in the gridiron pattern shown in Fig. 6. The coated wafer is cut along the pattern to form nickel plated dice such as shown in Fig. 7. This may be done by ganged diamond saws, by ultrasonic means or by other suitable methods. The portions of the wafer adjacent its edges are not used.

Another embodiment of the present invention is illustrated in Fig. 8. According to this embodiment, a silicon body, into which both phosphorous and boron have been diffused and which has layers of phosphosilicate glass and borosilicate glass on opposite surfaces thereof, is treated only with the hydrofluoric acid etching solution to selectively remove the phosphosilicate layer and prepare the N conductivity type side of the body for metal plating. The diffused body is immersed in the hydrofluoric acid in accordance with the procedure previously described which effects removal of the phosphosilicate layer and prepares the underlying surface for metal plating. Because of the highly selective nature of the hydrofluoric acid etching solution, the borosilicate layer 15 is essentially uneffected during this treatment. The etched surface of N-type conductivity is then lapped and metal is deposited as by the nickel plating procedure previously described. This produces a body having a cross-sectional structure as illustrated in Fig. 8 with a metal layer 16 on one side only. This method of coating only one side of the silicon body with metal for subsequent electrical connection thereto is particularly useful in the manufacture of semiconductor devices of very small area in which it is desired to solder electrical leads only to an area of one conductivity type without danger of shorting to a closely adjacent area of the opposite conductivity type. Since the borosilicate layer 15 is essentially unaffected by the hydrofluoric acid etching treatment plating may be carried out with deposition of the metal only on the N conductivity type layer 12 so that subsequently deposited metal forms only over the selected area thus eliminating the danger of shorting to the closely adjacent layer 13 of the P conductivity type. This method is much superior to previously employed methods of carrying out the same type of selective plating wherein it is necessary to mask the areas on which metal is not to be deposited. A point contact or other contact not requiring the presence of a metal layer may then be made to the P layer 13 in any suitable manner.

Fig. 9 illustrates the embodiment of the invention wherein it is desired to make a soldered connection only to the portion of the surface of the silicon body of the P conductivity type. In such cases the silicon body having closely adjacent layers of phosphosilicate glass and borosilicate glass is immersed only in the etching solution of alkali metal hydroxide and hydrogen peroxide previously described. Such treatment has essentially no effect on the phosphosilicate layer 14 while it dissolves the borosilicate layer 15 and prepares the surface 13 of the P conductivity type for subsequent metal deposition. Thus, metal deposition as carried out, for example, by the nickel plating method previously described produces a body of the type shown in Fig. 9 with a metallic layer on only one side of the body. As in the case of the embodiment illustrated in Fig. 8, a suitable contact such as a pressure contact may be made to the other side of the body as desired.

Figure 10:
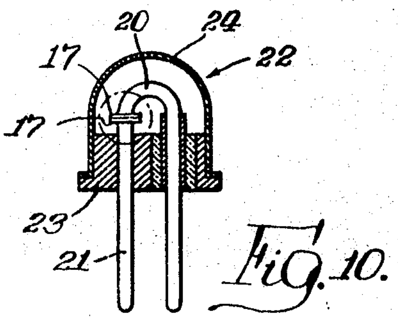
Fig. 10 is a view in vertical section of a semiconductor device embodying the nickel coated silicon die.
Figure 10A:
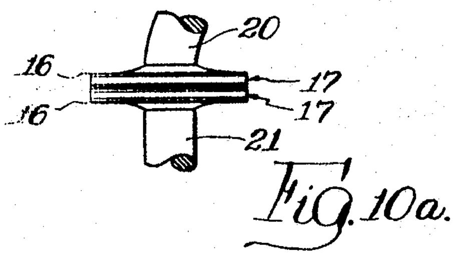
Fig. 10a is an enlarged view of the area circled in Fig. 10.

One particular application of the silicon die 17 nickel plated on both sides is illustrated in Figs. 10 and 10*a*, and the unit shown in these figures is the joint invention of Raymond J. Andres and Charles G. Thornton as described and claimed in a copending application Serial No. 666,902, filed on June 20, 1957, and assigned to the present assignee. A rectifier or diode 22 includes two soldered-together dice 17 held between the ends of conductive leads 20 and 21 which are, in turn, affixed to base 23. Cover member 24 is welded to the base 23 so that the dice 17 are in a sealed space. Leads 20 and 21 are soldered to nickel layers 16 and make ohmic contact one with each of the coated dice 17. The coated silicon die 17 may be employed in any other type of semiconductor device where it is necessary to make an ohmic contact with silicon by means of a nickel or similar metallic layer.

The present invention provides a method of preparing the surfaces of a silicon semiconductor body so that they may be metal plated for ohmic contact as by soldering without the necessity of employing pressure biased spring or similar contacting means. This in turn makes it possible to construct a reliable high voltage silicon diode adapted to a variety of uses, and which is inexpensive and easy to assemble.

I claim:

1. A process for treating a silicon base semiconductor body having a PN junction therein and having a glassy borosilicate layer covering one portion of its surface and a glassy phosphosilicate layer covering another portion of its surface to deposit metallic nickel on the semiconductor body, said process comprising contacting the entire surface of said semiconductor body with an aqueous solution of an etching agent selected from the group consisting of hydrofluoric acid and a combination of hydrogen peroxide with an alkali metal hydroxide, and subsequently contacting the entire surface of said semiconductor body with an aqueous solution of nickel chloride and sodium hypophosphite.

2. A process as defined in claim 1 wherein said body is contacted with both of the named etching agents in sequence.

References Cited in the file of this patent

UNITED STATES PATENTS

| | | |
|---|---|---|
| 2,419,237 | Treuting | Apr. 22, 1947 |
| 2,456,082 | Pessel | Dec. 14, 1948 |
| 2,689,805 | Croze et al. | Sept. 21, 1954 |
| 2,794,846 | Fuller | June 4, 1957 |
| 2,805,370 | Wilson | Sept. 3, 1957 |
| 2,809,103 | Alexander | Oct. 8, 1957 |
| 2,811,682 | Pearson | Oct. 29, 1957 |
| 2,906,647 | Roschen | Sept. 29, 1959 |